United States Patent [19]

Kahr

[11] Patent Number: 4,809,772
[45] Date of Patent: Mar. 7, 1989

[54] HEAT SINK MOUNTING MEMBER
[75] Inventor: Rene A. Kahr, Andover, Mass.
[73] Assignee: Electronic Instrument & Specialty Corp., Stoneham, Mass.
[21] Appl. No.: 67,157
[22] Filed: Jun. 29, 1987
[51] Int. Cl.$^4$ .............................................. H05K 7/20
[52] U.S. Cl. .................. 165/80.3; 174/16.3; 361/383
[58] Field of Search .................. 361/379, 383, 384; 165/185, 80.2, 80.3; 357/81; 174/16 HS

[56] References Cited

U.S. PATENT DOCUMENTS

| | | | |
|---|---|---|---|
| 3,213,336 | 10/1965 | McAdam | 165/80.3 X |
| 3,582,865 | 6/1971 | Franck | 361/383 X |
| 3,940,665 | 2/1976 | Seki | 361/383 |
| 3,961,666 | 6/1976 | Suzuki et al. | 165/80.3 X |
| 4,365,288 | 12/1982 | Robe et al. | 361/383 X |
| 4,620,263 | 10/1986 | Ito | 361/384 |
| 4,709,560 | 12/1987 | Voorhis et al. | 361/384 |

FOREIGN PATENT DOCUMENTS 1439308 12/1968 Fed. Rep. of Germany ...... 361/383

Primary Examiner—Ira S. Lazarus
Assistant Examiner—Peggy Neils
Attorney, Agent, or Firm—Joseph S. Iandiorio; Brian M. Dingman

[57] ABSTRACT

A heat sink mounting member including a tubular member having a longitudinal axis extending through the two open ends thereof. There are means for mounting the back of the tubular member to a mounting device and recesses in the front of the modular member for permitting access to the means for mounting the back of the tubular member. The front of the tubular member includes means for mounting a device to have its heat dissipated to the tubular member to dissipate heat by conduction through the tubular member and convention of air passing through the open ends of the tubular member.

7 Claims, 2 Drawing Sheets

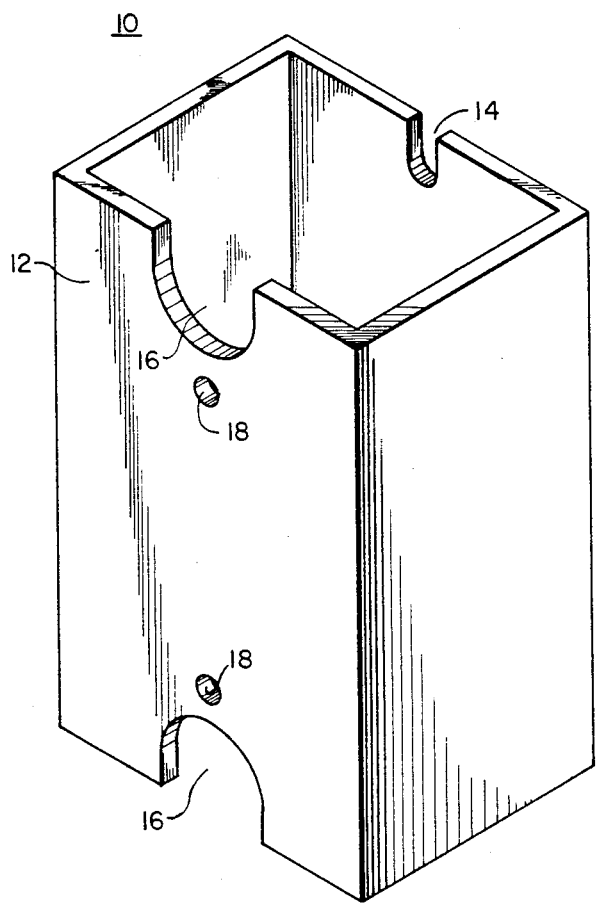
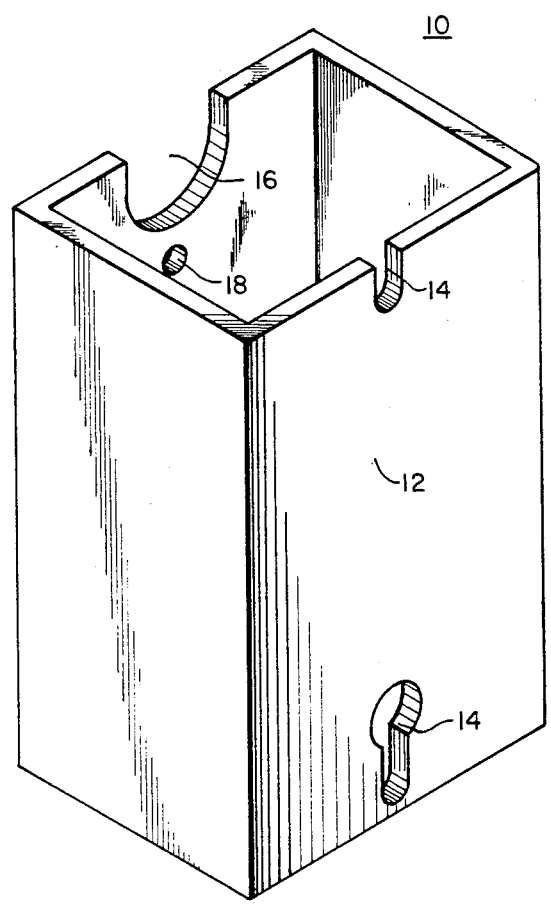
FIG. 1    FIG. 2
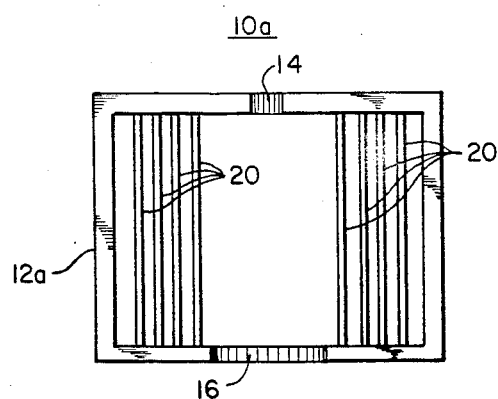
FIG. 3

HEAT SINK MOUNTING MEMBER

FIELD OF INVENTION

This invention relates to a heat sink mounting member and more particularly to a device which can replace traditional solid state relay heat sinks that are mounted on standard relay mounting strips and which efficiently dissipates heat generated by the relay.

BACKGROUND OF INVENTION

In conventional techniques for heat sinking solid state relays, the relay is typically mounted on a heat sink with a plurality of fins extending from the area in which the relay is mounted. However, these conventional heat sinks possess several problems which make them impractical and inefficient. Because heat sinks generally possess heat sink fins extending from the relay housing, it can be difficult to access the relay for installation, service and removal. Additionally, the heat sink fins can get clogged with dirt and lose their effectiveness. When being cleaned of this accumulated dirt, the fins can easily be bent or broken, thereby decreasing heat sink efficiency. These damaged fins can also cause injury to the servicing technician.

As typical solid state relay installations may be in a factory floor environment, these relays often need to be isolated within standard-type electrical cabinets. Because these cabinets present space restrictions, traditional heat sinks possessing fins make inefficient use of existing space due to the volume required to present sufficient fin surface area to remove unwanted heat. Thus, traditional heat sink mounted relays may take more than one mounting position on a standard relay mounting strip or may extend above or below the strip, thereby interfering with wiring harness routing and placement of adjacent relay mounting strips.

SUMMARY OF INVENTION

It is therefore an object of this invention to provide an improved heat sink mounting member which efficiently dissipates heat generated by a solid state relay.

It is a further object of this invention to provide a heat sink mounting member which will conveniently fit on existing standard relay mounting strips.

It is a further object of this invention to provide a heat sink mounting member which can be used in installation or replacement of relay heat sinks in electrical cabinets.

It is a further object of this invention to provide a heat sink mounting member which has no external fins which can clog with dirt, break or bend.

It is a further object of this invention to provide a heat sink mounting member which will take up only one mounting position on a standard relay mounting strip.

It is a further object of this invention to provide a heat sink mounting member which will not extend above or below a standard relay mounting strip in order to permit close spacing of strips and allow room for wiring harness routing.

It is a further object of this invention to provide a heat sink mounting member which is approximately the same size as traditional heat sink mounted relays.

It is a further object of this invention to provide a heat sink mounting member which is easy to install and remove.

It is a further object of this invention to provide a heat sink mounting member which is more rugged than existing heat sink mounting members.

This invention results from the realization that effective heat sinking of electronic components can be accomplished with a compact, lightweight tubular heat sink mounting member with no external fins which operates to efficiently dissipate heat by convection of air passing through the open ends of the member.

This invention features a heat sink mounting member which is made up of a tubular member with a longitudinal axis extending through its two open ends. There are means for mounting the back of the tubular member to a mounting device and recess means in the front of the tubular member for permitting access to the means for mounting the back of the tubular member. In addition, there are means for mounting a device to have its heat dissipated to the front of the tubular member to dissipate heat by conduction through the tubular member and convection of air passing through the open ends of the tubular member.

In a preferred embodiment, the means for mounting the back of the tubular member is positioned to hold the longitudinal axis of the tubular member in a substantially vertical position when the means for mounting the back of the tubular member is engaged with the mounting device. The tubular member may have an essentially rectangular cross-section and may be made of black anodized aluminum. In an alternative preferred embodiment, the tubular member includes a plurality of planar cooling fins extending from its inner walls.

The means for mounting the back of the tubular member may include recess means for engaging the mounting screws of a relay mounting strip. Alternatively, the means for mounting the back of the tubular member may include clip means for engaging the upper and lower rails of a relay mounting strip. In this embodiment, means for attaching the clip means to the back of the tubular member are included. The recess means may include slanted tubular member sides for making the front of the tubular member smaller than the back of the tubular member.

The rectangular tubular mounting member may be narrow enough to occupy only a single relay position on a standard relay mounting strip. In addition, the height of the tubular member may be limited so that it does not extend above or below the relay mounting strip when the means for mounting the back of the tubular member is engaged with the mounting strip. The tubular member may be made of black anodized aluminum.

In another alternative preferred embodiment, the heat sink mounting member may include a tubular member with a longitudinal axis extending through its two open ends and a means for mounting the back of the tubular member to a rail mounting device. In addition, there may be means for mounting a device to have its heat dissipated to the front of the tubular member to dissipate heat by conduction through the tubular member and convection of air passing through the open ends of the tubular member.

The means for mounting the back of the tubular member may include clip means for engaging the upper and lower rails of a relay mounting strip. There may also be means for attaching the clip means to the back of the tubular member. This clip means would allow the heat sink mounting member to engage a rail-type relay mounting strip by sliding on or clipping on.

The means for mounting the back of the tubular member may be positioned to hold the longitudinal axis of the tubular member in a substantially vertical position when the means for mounting the back of the tubular member is engaged with the rail mounting device. The tubular member may have an essentially rectangular cross-section and may be made of black anodized aluminum. In addition, the tubular member may include a plurality of planar cooling fins extending from the inner walls thereof.

DISCLOSURE OF PREFERRED EMBODIMENTS

Other objects, features and advantages will occur from the following description of preferred embodiments and the accompanying drawings, in which:

FIG. 1 is an axonometric view of a heat sink mounting member according to this invention;

FIG. 2 is a rear axonometric view of the heat sink mounting member of FIG. 1;

FIG. 3 is a top plan view of an alternative heat sink mounting member according to this invention;

Figure 4:
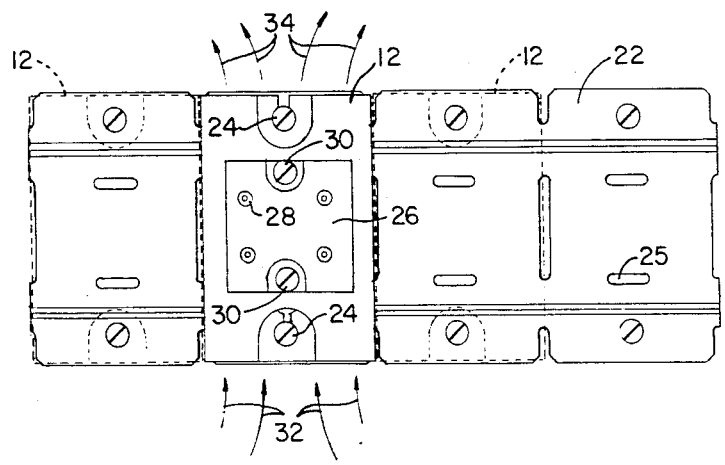
FIG. 4 is a front elevational view illustrating the mounting of several heat sink mounting members on a relay mounting strip.

A heat sink mounting member according to this invention may be accomplished using an elongated tubular member having a rectangular cross-section. An electronic device such as a chassis mount solid state relay to have its heat dissipated is mounted to the front of the tubular member. The heat generated by the relay is then dissipated by conduction through the tubular member and convection of air passing through the open ends of the tubular member in a chimney-like effect.

The heat sink mounting is preferably narrow enough to occupy only a single relay position on a standard relay mounting strip. Typically, this width is 2.25 inches. In addition, the height of the tubular member is limited so it does not extend above or below the standard relay mounting strip when it is mounted thereon. This height is typically 3.5 inches. The heat sink mounting member is preferably deep enough to hold a solid state relay mounted on it approximately the same distance from the relay mounting strip as a traditional heat sink mounted relay. This depth is typically 1.75 inches. In order to have the strength and heat dissipation characteristics required, the tubular member is typically made of black anodized aluminum.

Means for mounting the back of the tubular member to the relay mounting strip are provided. These means are positiioned to hold the tubular member in a substantially vertical position when it is engaged with the mounting strip. Typically, these means for mounting include recess means in the back of the tubular member for engaging the mounting screws of a standard relay mounting strip. Alternatively, the means for mounting the back of the tubular member may include clip means for engaging the upper and lower rails of a rail-type relay mounting strip. In this embodiment, the clips are preferably 35 mm apart in order to accommodate the rails of a standard rail-type relay mounting strip. This embodiment may further include means such as bolts for attaching the clip means to the back of the tubular member.

The front of the tubular member may have recess means for permitting access to the means for mounting the back of the tubular member to the relay mounting strip. Typically, these recess means may include slot cutouts at the upper and lower ends of the tubular member to permit a screwdriver blade to pass through the meet the mounting screws of a standard relay mounting strip. Alternatively, these recess means may be effected by slanted sides which give the tubular member a trapezoidal shape.

In an alternative preferred embodiment, the tubular member may include a plurality of planar cooling fins extending from its inner walls. In this case, the fins extend across the inside of the tubular member in such a way as to not interfere with the screwdriver access to the means for mounting the back of the tubular member to the relay mounting strip. Thus, the area for heat transfer is increased without encountering the problems which make conventional finned heat sinks impractical and inefficient.

There is shown in FIG. 1 a heat sink mounting member 10 including tubular member 12. Means for mounting the back of the tubular member to a mounting device 14, and recess means 16 in the front of the tubular member for permitting access to the means for mounting the back of the tubular member are shown. The member includes means 18 for mounting the device to have its heat dissipated to the front of the tubular member.

The means for mounting the back of the tubular member to a mounting device are shown in detail in FIG. 2. Slots 14 are formed to accept the mounting screws of a standard relay mounting strip. Recess means 16 allow access to the mounting screws from the front of tubular member 12 by a screwdriver or other mounting tool.

FIG. 3 shows an alternative embodiment of a heat sink mounting member 10a of this invention. In this embodiment, the tubular member 12a includes a plurality of planar cooling fins 20 extending from its inner walls. These fins 20 are limited to areas inside tubular member 12a so as not to interfere with access to mounting means 14 through recess means 16.

A typical installation is shown in FIG. 4. Here, tubular member 12 is mounted on standard relay mounting strip 22 by means of mounting screws 24. Relay mounting strip 22 is typically mounted in an electrical enclosure by screws, not shown, passed through mounting slots 25. Chassis mount solid state relay 26 is mounted to the front of tubular member 12 by bolts 30. Relay 26 typically has a number of terminals such as terminal 28 to permit attachment of current-carrying wires. Arrows 32 and 34 are a schematic representation of air flow through the tubular member and indicate the direction of convection currents passing through the tubular member in a chimney-like fashion. In this manner, the heat generated by the solid state relay 26 is efficiently dissipated.

Additional heat sink mounting members 12 shown in phantom in FIG. 4 serve to illustrate that the preferred heat sink mounting member takes up only one mounting space on the standard relay mounting strip and does not extend above or below the strip. In addition, tubular member 12 is preferably deep enough to hold the solid state relay 26 approximately the same distance from the relay mounting strip as a traditional heat sink mounted relay. This depth permits ease of access to the relay and its terminals and wires and also takes full advantage of the available depth to provide an adequate surface area for heat dissipation. In this manner, the space on the relay mounting strip is most efficiently utilized.

Figure 5A:
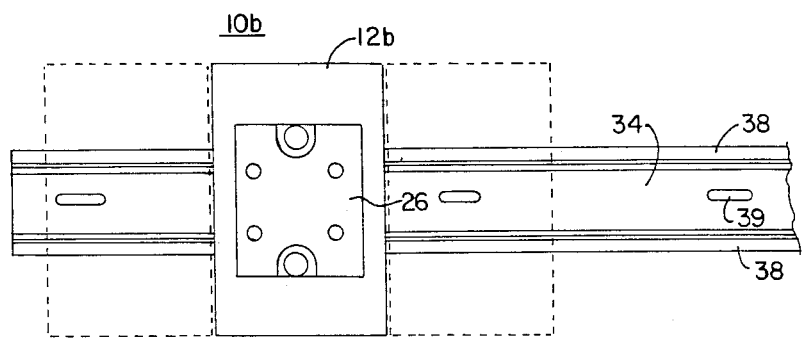
FIG. 5A is a front elevational view of an alternative embodiment of a heat sink mounting member mounted on a rail-type relay mounting strip.
Figures 5B, 6:
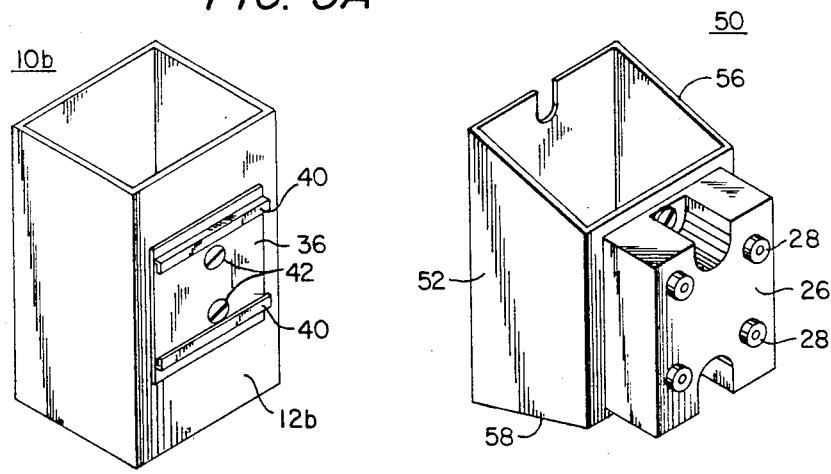
FIG. 5B is a rear axonometric view of the heat sink mounting member and mounting means of FIG. 5A.
FIG. 6 is an axonometric view of an alternative construction of the heat sink mounting member of FIG. 1.

An alternative heat sink mounting member and means for mounting it to a relay mounting strip are illustrated in FIGS. 5A and 5B. FIG. 5A is a front view of heat sink mounting member 10b which includes tubular member 12b attached to a standard rail-type relay mounting strip 34. Mounting strip 34 is typically mounted in an electrical enclosure by screws, not shown, passed through mounting slots 39. As best shown in FIG. 5B, the means for mounting the back of tubular member 12b to the rail mounting device includes clip means 36. This clip means includes clip rails 40 which are typically 35 mm apart in order to accomodate rails 38, FIG. 5A, of standard rail-type relay mounting strip 34. Clip means 36 may be attached to the back of tubular member 12a by bolts 42. Clip means 36 may be positioned to allow contact with rails 38 by sliding engagement or by clipping engagement.

An alternative way of effecting the recess means in the front of the tubular member is shown in FIG. 6. Tubular member 52 includes slanted sides 56 and 58 which give it a trapezoidal shape. These slanted sides are preferably shallow enough to permit access to the means for mounting the back of the tubular member to a mounting device and still leave plenty of area on the front of tubular member 52 to permit mounting of solid state relay 26 with terminals such as terminals 28.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A heat sink mounting member for a chassis mount solid state relay comprising:

an elongated tubular member including a back, a front and two open ends, having an essentially rectangular cross section taken transversly to a longitudinal axis extending through the open ends of said tubular member;

means for mounting the back of said tubular member to a relay mounting strip, said means being positioned to hold said longitudinal axis in a substantially vertical position when said means for mounting is engaged with said mounting strip;

recess means in the front of said tubular member for permitting access to said means for mounting the back of said tubular member; and means for mounting a chassis mount solid state relay to have its heat dissipated to the front of said tubular member to dissipate heat by conduction through said tubular member and convection of air passing through said open ends of said tubular member.

2. The heat sink mounting member of claim 1 in which said tubular member is narrow enough to occupy only a single relay position on said relay mounting strip when said means for mounting the back of said tubular member is engaged with said mounting strip.

3. The heat sink mounting member of claim 2 in which said tubular member does not extend above or below said relay mounting strip when said means for mounting the back of said tubular member is engaged with said mounting strip.

4. The heat sink mounting member of claim 1 in which said tubular member is made of black anodized aluminum.

5. The heat sink mounting member of claim 1 in which said tubular member includes a plurality of planar cooling fins extending inwardly from the walls thereof.

6. The heat sink mounting member of claim 1 in which said means for mounting the back of said tubular member includes recess means for engaging mounting screws of a relay mounting strip.

7. The heat sink mounting member of claim 1 further including side members slanted from back to front for making said front of said tubular member smaller than said back of said tubular member for permitting access to said means for mounting the back of said tubular member.

* * * * *